United States Patent [19]

Schroeder

[11] Patent Number: 4,878,846

[45] Date of Patent: Nov. 7, 1989

[54] ELECTRONIC CIRCUIT CHIP CONNECTION ASSEMBLY AND METHOD

[76] Inventor: Jon M. Schroeder, Apt. 1013, 9815 Copper Creek, Austin, Tex. 78729

[21] Appl. No.: 358,503

[22] Filed: May 30, 1989

Related U.S. Application Data

[63] Continuation of Ser. No. 178,252, Apr. 6, 1988, abandoned, which is a continuation-in-part of Ser. No. 854,920, Apr. 23, 1986, abandoned.

[51] Int. Cl.$^4$ .............................................. H01R 9/09
[52] U.S. Cl. ........................................ 439/65; 439/68; 439/73; 357/75; 361/400
[58] Field of Search ................. 357/75; 361/395, 399, 361/400; 439/65, 68–73, 330, 331

[56] References Cited

U.S. PATENT DOCUMENTS

| | | | |
|---|---|---|---|
| 3,571,915 | 3/1971 | Shirland | 357/75 |
| 4,330,812 | 5/1982 | Token | 361/399 |
| 4,688,150 | 8/1987 | Peterson | 361/400 |

FOREIGN PATENT DOCUMENTS

| | | | |
|---|---|---|---|
| 0008976 | 1/1979 | Japan | 357/75 |
| 0225966 | 11/1985 | Japan | 361/400 |

OTHER PUBLICATIONS

IBM Technical Disclosure Bulletin, "Interconnection Alignment Multichip Module", vol. 15, No. 10, Mar. 1973.

Primary Examiner—Gary F. Paumen
Attorney, Agent, or Firm—J. F. Long

[57] ABSTRACT

This assembly allows connecting in one operation a plurality of chips to chips and to a substrate or each chip to a substrate using an elastomeric pressure means that continues to pressure chips connecting micron sized leads to chip pads on one end and to circuitry on a substrate on the other end; a metallic cover fastening to the substrate and containing said electronic pressure means also includes a ribbed projection to hermetically seal the unit so that the substrate itself becomes an integral part of the assembly package.

11 Claims, 4 Drawing Sheets

ELECTRONIC CIRCUIT CHIP CONNECTION ASSEMBLY AND METHOD

This application is a continuation of Ser. No. 178,252, filed Apr. 6, 1988, now abandoned, which is a continuation-in-part of Ser. No. 854,920, filed April 23, 1986, now abandoned.

BACKGROUND OF THE INVENTION

This invention relates generally to the technical field of electrical transmission and interconnection and more particularly to interconnecting an electronic circuit composed of bare monolithic integrated electronic circuit chips and other passive and active devices and elements.

Monolithic integrated electronic circuit chips as generally known are a bare chip inside a package with the input-output ports or pads electrically connected to contacts that lead outside the package enclosure and require further coupling to external circuits with the use of a printed circuit board for their proper operation. Such coupling is necessary for supplying power for such circuits to operate, for applying input signals to such circuits, and for transmitting output signals from such circuits to other devices. The small, rectangularly shaped, conductive areas, frequently referred to in the trade as pads of the monolithic electronic circuit chips are generally arranged about the periphery of one of the chip's planar surfaces, are used for coupling the chip to conductive leads of the enclosing package which in turn couples via soldered leads to external circuits of the printed circuit board which are frequently referred to as traces.

Presently, the various types of mechanical enclosures in which such monolithic integrated electric circuit chips are packaged include a plurality of conductor leads adapted to interconnect such pads of the chip by individually connected wires to corresponding electrical conductors of the package which in turn connect with solder or pins to sites on the traces of a printed circuit board.

The method employed most widely to establish the interconnection between the monolithic integrated electronic circuits chip's pads and the conductors of the package enclosure includes bonding a plurality of individual electrical wires between pads and other conductors included in the package enclosing the chip. Most commonly, each such individual wire is attached to the monolithic electronic circuit chip's pads manually either by thermo-compression bonding or by ultrasonic bonding. The use of Very High Speed Integrated Circuits, (VHSIC) which drastically increases the density and quantity of semiconductor elements possible on a chip and increases the number of functional monolithic electronic circuit chips that can be manufactured on a single semiconductor wafer, brings about a real need to reduce the size of the input/output pads and to reduce the size of connectors to these pads to accommodate the 100 to 400 leads required to access the higher density circuits. The reduction in connector size made possible by this invention will allow reduction in pad size to allow full advantage of VHSIC processing with resultant economic benefits.

Further, in the assembly of advanced monolithic integrated electronic circuit chips using the semiconducting compound, Gallium Arsenide, merely heating these devices during an assembly process has a detrimental effect on the electrical performance of such chips.

A process is needed that connects in a simple fashion, all necessary electronic and electrical elements of a system with minimum labor and without the application of heat. The present invention covers this need.

Recognizing that significant economies might be achieved if it were possible to simultaneously form all the interconnections of on electronic system made up of numerous monolithic integrated electronic circuit chip's (hereinafter called electronic circuit chip) pads simultaneously in a single operation, attempts have been made to develop methods and machines to perform such interconnections employing a plurality of conductors; however, manual bonding employing a plurality of individual wires presently remains the most widely used method.

In addition to requiring relatively expensive, manual methods for interconnecting the pads of the electronic circuit chip with conductors included in chip package, generally that package's shape and the structure such as pins used to interconnect that package to the printed circuit board's traces occupy a significant amount of space on the board. The board space has an area cost equal to that of the electronic chip and packaging.

Further, the most widely used electronic circuit chip package also exhibits significant differences among the electrical characteristics of the various conductors from the chip to the printed circuit which can upset the timing of signals critical to the proper operation of an electronic circuit chip.

Responding to these various deficiencies in the present integrated circuit packaging technology, a new assembly for and method of precisely interconnecting numerous unpackaged electronic circuit chips to form an electronic system was invented. This new assembly and method, which is described in Ser. No. 854,920, included an elastomeric pressure member containing an aperture to receive a chip and a second elastomeric pressure member to go below a chip placed in the aperture. Conductive leads with conductors on each end and supported on a photo-resist membrane inside a frame of aluminum placed between the chip and lower elastomeric pressure member connect the pads of the chip and the traces of a printed circuit board when a metallic cover sized to compress the elastomeric pressure member about 30% was urged toward the circuit board to complete the assembly.

Briefly, in one preferred embodiment of the present invention, one elastomeric pressure member is placed above one or more chips which in turn are placed so that the chip pads contact the connector on one of the electrical leads supported on photo-resist with the other end of these electrical leads having a connector to connect to traces on a substrate when the one elastomeric pressure member is urged toward the substrate by a metallic cover.

A particular advantage of this new electronic circuit chip package is that it efficiently dissipates heat generated by the chips operation to the surrounding atmosphere if the assembly's cover is fabricated from a high thermal conductivity material such as a metal.

While such efficient heat dissipation is necessary to the operation of certain types of integrated circuits such as those employing emitter-coupled logic circuits, high performance linear circuits, and high performance random access memory, not all types of monolithic integrated circuit chips require such efficient heat dissipation. For example, integrated circuit chips employing complimentary MOS circuits ("CMOS") generally do not generate a great deal of heat nor do they frequently require an electrical connection to their substrate; however, more advanced integrated circuit chips made with Gallium Arsenide do require good heat dissipation and have improved life if a cold pressure connection of the chip pads to external leads is made.

Another advantage of the present invention is that it provides a simpler and less costly assembly for and method of connecting electronic circuit chips to a substrate or printed circuit board to allow the formation of distributed systems operating in close proximity with physical sensors and actuators. This is desireable for more effective and reliable control and operation of machines such as hypersonic aircraft, missiles, and submarines.

Another advantage of the present invention is that it requires only a small area of a substrate or printed circuit board for coupling electronic circuit chips thereto.

Still another advantage of the present invention is that it provides conductors having closely matched characteristics for coupling an electronic circuit chip to a substrate or printed circuit board. The substrate or printed circuit board can also be formed to couple the electronic circuit chip with such devices as terminating resistors, grounded shielded coaxial conductors that are tuned for matched impedances at each end of the transmission line to transmit two-way signals between chips and graded in-route to achieve a higher performance, low noise, low reflection signal between interfaces.

An object of the present invention is to provide a simpler and less costly assembly for and method of connecting a number of unpackaged electronic circuit chips to a substrate or printed circuit board so that they may function in a more complete circuit.

Another object of the present invention is to provide an assembly for connecting a number of unpackaged electronic circuit chips to a printed circuit board in such a manner that the total assembly occupies a small area on the substrate or printed circuit board.

Another object of the present invention is to provide an assembly for connecting a number of electronic circuit chips to a substrate or printed circuit board wherein closely matched characteristics among the numerous conductors allows a comparable electron travel time during operation.

Another object of the present invention is to provide an assembly for connecting a number of electronic circuit chips to a substrate or printed circuit board which is suitable for use with chips requiring a large number of individual connections.

Another object of the present invention is to provide an assembly for connecting a number of electronic circuit chips to a substrate or printed circuit board containing sensors, actuators, and effectors and other integrated elements that become a part of the board by process and are in close proximity and in communication with the chips assembly.

Another object of the present invention is to provide conducting leads with connectors on either end supported on photo-resist in an aluminum tape along with an elastomeric pressure member such that any electronic circuit chips regardless of metalization system can be pressure connected by the methods of this invention.

Another object of the present invention is to provide an interconnection means for high density chips having pad sizes as small as eight microns on the side and spaced as close as ten microns between adjacent pad centers thereby allowing use of closely spaced pads on chips to give an improvement in productivity for electronic circuit manufacturers.

Still another object of the present invention is to provide a manufacturing method that will allow total automation of an otherwise labor intensive portion of industry. Presently, much of the electronic circuit manufacture is located off-shore to take advantage of cheap labor.

Briefly, these and other objectives and advantages are accomplished in one preferred embodiment of the present invention by an assembly which includes a conductive preform which has conductive leads with micron size connectors on each end so located as to connect with pads on chips and circuitry on a printed circuit board when a number of electronic circuit chips are placed on an upper surface on the conductive preform and the chips are urged toward the substrate or printed circuit board by a metallic cover containing an elastomeric pressure means with micron size connectors on a photo-resist film of the conductive preform causing a plurality of conductors of the conductive preform to connect with pads on the electronic circuit chips and traces on a substrate or printed circuit board.

In one preferred embodiment, the elastomeric pressure member is fabricated from a resilient elastomer material such as silastic No. 184 and includes a concentric, raised rib which encircles the periphery and projects toward the substrate or printed circuit board. With the elastomeric pressure means located within the cover, the flat surface of the elastomeric pressure means makes intimate contact with the interior surface of the cover when the cover is secured to the substrate or printed circuit board. When so assembled, the projection of the elastomeric means above the chips apply a force to the back of the chips which in turn applies pressure to pads of each chip urging the chip pads into intimate contact with the chip connector on one end of the conductive leads and at the same time longer projections on the elastomeric pressure means urge connectors on the other end of the conductive leads into intimate contact with circuitry on the substrate or printed circuit board traces. The chips have extremely flat surface on which the pads are formed and when pressed against connectors on the conductive leads supported on photo-resist film of the conductive preform with sufficient pressure some of the silver connectors on soft aluminum sink into the aluminum until all connectors of a particular chip make even contact with flat surface pads on the chip with the aluminum conforming to the more irregular surface of the substrate or printed circuit board below. The height of the interior of the cover is more or less 30% less than the thickness of the elastomeric pressure means plus projections over the chips and conductive leads on the preform in order that securing the cover to the substrate or printed circuit board produces and maintains sufficient pressure to maintain connection of chips to substrate in one embodiment and chip to chip and then to substrate in a second embodiment. The pressure on the backside of each chip being on the order of 1 to 2 pounds becomes amplified to a force of approximately 10,000 pounds per square inch distributed to each connector contacting the chip pads and each will be maintained in contact with pads of the chips by the elastomeric pressure means for a 20 year life as determined from accelerated life tests of the silastic used to form the elastomeric pressure means.

Similarly compressed, the raised ribs seals between the surfaces of the cover and the substrate or printed circuit board to hermetically enclose the electronic circuit chips within the assembly.

In those instances in which proper operation of an electronic circuit chip requires forming a connection to the chip's substrate, an alternative embodiment of the present invention further employs a substrate connection means which is applied to the surface of the elastomeric pressure means before contacting the chip. Such substrate connection means extends outward beyond the periphery of the chips with a connector to contact circuitry on the substrate or one of the printed circuit board's traces. In this alternative embodiment of the invention, a projection projects from the elastomeric pressure means to apply a force urging the substrate connection means into intimate contact with the circuitry on the substrate or a trace on a printed circuit board.

In addition to establishing a barrier to electrical conductivity, the elastomeric pressure means affects the flow of heat out of the electronic circuit chips into the atmosphere surrounding the assembly. Tests conducted indicated that heat transfer through the compressed elastomeric pressure means placed between the cover and operating chips is 15 degrees Celsius per Watt and compares favorably with that of chips in physical contact against a metallic cover, probably owing to the fact that chips do not make perfect contact with the cover whereas the compressed elastomeric pressure means makes intimate contact with the metallic cover so that a greater contact area off sets lower conductivity through the elastomer.

We have generally described a unique method for pressure connecting the input/output pads on an electronic circuit chip with electronic circuitry on a substrate or with other chips in one operation in such a fashion that continued pressure from an elastomeric pressure means maintains the pressure connections under shock or adverse conditions with the same operation serving to hermetically seal the assembly.

BRIEF DESCRIPTION OF THE INVENTION

This invention covers an assembly for directly connecting pads or input/output connections of a plurality of electronic circuit chips to electronic circuitry on a substrate. An elastomeric material or pressure means inside a rigid metallic cover is used to put pressure on the electronic circuit chips placed above a conductive preform. The conductive preform is properly placed so that elongated connectors on leads adhering to the photo-resist sites on the conductive preform will contact the electronic circuitry on the substrate while less-than-30-micron sized connectors on the other end of the leads will contact pads on the chips. When less-than-30-micron sized connectors are used on each end of conductive leads then chip pads may be linked to chip pads so that a plurality of chips may be linked together and then connected to electronic circuitry on a substrate.

The assembly may be briefly described as follows:
a. a substrate with surface mounted electronic circuitry thereon
b. a conductive preform placed on the substrate
c. one or more electronic circuit chips placed on the conductive preform
d. an elastomeric pressure means inside a rigid metallic cover that encompasses the conductive preform with chips thereon
e. means to fasten the rigid metallic cover to the substrate.

The following description of method of making the conductive preform will aid in understanding the unique features of this invention:

1. An aluminum strip approximately 0.75 mil thick and one inch wide is coated on both sides with 2.5 micron photo-resist material which may contain a slurry of glass beads approximately 1 micron in diameter.

2. An optical pattern is made defining areas of the aluminum to be silver plated on one side of the aluminum and areas to be etched away or dissolved on the other side after exposing the photo-resist material with ultraviolet light and removing the exposed area by developing. The pattern is such that photo-resist is selectively removed in a number of photo-resist sites depending upon the number of chips desired under one cover or one unit. Each photo-resist site is similar. In one embodiment a portion of the photo-resist is removed between the sites to allow making chip to chip connecting leads as we will later describe. In a first embodiment photo-resist is removed from one side so as to have micron sized aluminum strips covered with photo-resist. From the other side photo-resist is removed to allow plating through to form silver connectors on the micron sized aluminum strips; on one end of the micron sized aluminum strips where the connectors will contact the pads of the chips there will be less-than-30-micron sized holes removed; on the other end an elongated hole which may be 30 microns wide and 200 microns long is formed. The second hole is located so that the photo-resist remains on only about one half of the end of the area that will become the aluminum lead below the hole. Thus when after silver plating the aluminum is removed by dissolving the portion not protected by photo-resist this connection may be pushed downward to make electrical contact with circuitry below. Since photo-resist covers the micron sized leads below the less-than-30-micron sized silver connectors on the other end of the lead this connection will not make electrical contact with circuitry below the preform but when properly located will contact pads on the chip placed on the preform.

3. With photo-resist selectively removed the tape is floated through a bath to electroplate through the holes to the exposed aluminum.

4. The tape is then turned over and floated thru a caustic bath to etch away aluminum not covered with photo-resist and have leads with silver plated connectors on the ends of the leads. The photo-resist sites of the preform may then have conductive aluminum leads of micron width adhering to photo-resist with less-than-30 micron sized connectors on one end of conductive leads, with photo-resist covering the lead and the underside of the less-than-30 micron sized connector. On the other end of the conductive leads the elongated connector is only partially covered on the underside with photo-resist so it may be pushed downward to connect to electrical circuitry.

Conductive leads as described can be formed with less-than-30 micron sized silver on aluminum connectors on each end and these may go between photo-resist sites to link pads of chips together. Now with a conductive preform with conductive leads adhering to photo-resist as described and an elastomeric pressure means inside a rigid metallic cover, pressure from biasing the cover toward the substrate will make electrical connections from chip to chip and/or chip to electronic circuitry on a substrate depending on the details of the conductive preform. The elastomeric pressure means has shorter projections above the chip as they are placed on photo-resist-sites and longer projections above the elongated connectors; the downward pressure produced as the rigid metallic cover containing the elastomeric pressure means is biased toward the substrate causes the less-than-30-micron sized connectors to connect with chip pads and the elongated connectors to connect to circuitry on the substrate. One to two pounds pressure above the chip will produce sufficient pressure to cause the silver of less-than-30 micron sized connectors to sink into the aluminum below, if necessary, in order to compensate for differences in flatness between the substrate and the very flat surface of the chip.

The elastomeric means inside the rigid metallic cover continuously maintains pressure on the connections compensating for shock and for thermal expansion and contraction of the unit. A rib-like projection around the periphery of the elastomeric pressure means serves to hermetically seal the cover, chips, and preform to the substrate.

We have described in detail the connection of chips to substrate in one embodiment. In a second embodiment a minor modification of the leads supported on photo-resist film of the preform can be made so that a plurality of chips may be linked together before connecting the terminal ends of such plurality of chips to circuitry on the substrate or traces on a printed circuit board.

Although the present invention has been described in terms of presently preferred embodiments, it is to be understood that such disclosure is purely illustrative and is not to be interpreted as limiting. Consequently, without departing from the spirit and scope of the invention, various alterations, modifications, and/or alternative applications of the invention will, no doubt be suggested to those skilled in the art having after read the preceding disclosure. Accordingly, it is intended that the claims and specifications be interpreted as encompassing all alterations, modifications, or alternate applications as falls within the true spirit and scope of the invention.

DETAILED DESCRIPTION OF THE DRAWINGS

Figure 1:
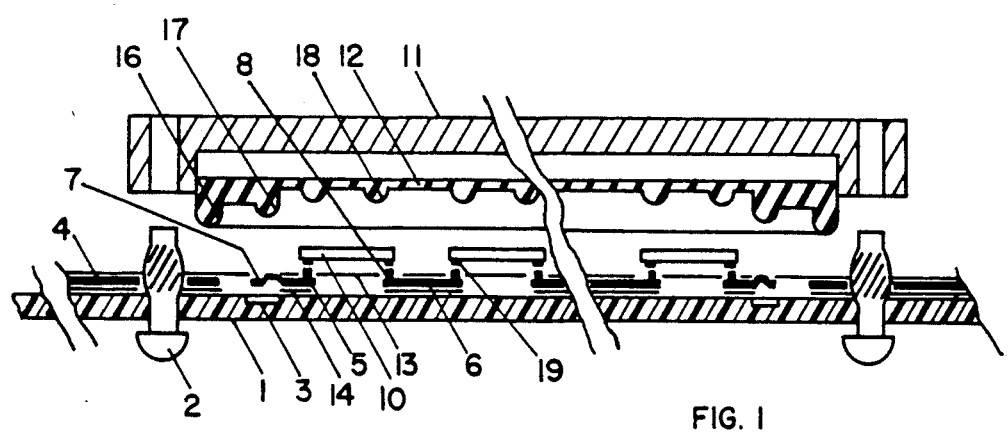
FIG. 1 shows a longitudinal cross section of a first embodiment of the assembly. In this embodiment as shown, a plurality of chips may be directly linked together and the plurality then connected with wiring on a substrate. A substrate with electrical receiving wiring or electronic circuitry such as a printed circuit; a conductive preform supporting connector leads; an elastomeric pressure member and a metallic cover with fasteners are shown.

Since we have eleven separate drawings to explain two embodiments, we are listing the numbers with descriptive terminology in Table 1 to facilitate understanding. The same item bears the same number throughout all figures.

TABLE 1

1. Substrate
2. Fastener to urge metallic cover toward substrate
3. Electronic circuitry on the substrate
4. Aluminum tape approximately 0.75 mil thick
5. A first type conductive lead to make chip to substrate connections
6. A second type conductive lead to make chip to chip connection
7. Elongated connector at end of lead 5 to connect with electronic circuitry on substrate 3
8. Less-than-30-micron sized connector to connect to pads of each chip
10. An electronic circuit chip
11. Rigid metallic cover
12. Elastomeric pressure means for first embodiment
13. Photo-resist film-leads 5 and 6 adhere to this photo-resist film
14. Photo-resist film on underside of leads 5 and 6
15. Conductive preform
16. Sealing rib
17. Secondary projections that are longer than primary projections 18 to pressure connect elongated connector 7 with electronic circuitry 3
18. Primary projections on elastomeric pressure means
19. Pads or input/output ports on chips 10
22. Elastomeric pressure means for second embodiment
23. Photo-resist film, FIG. 5, 6, and 6A; leads 5 adhere to this photo-resist film
24. Photo-resist film on underside of leads 5, FIG. 5

25. Conductive preform of second embodiment
26. Sealing rib for second embodiment
27. Projections above elongated connectors 7
28. Projections above chips 10
30. Mini-circuit board
31. Plug-in connectors
32. Circuit board In FIGS. 1, 2, and 3, photo-resist film 13, FIG. 1 which is above and between and adhering to the upper side of leads 5 and leads 6, and photo-resist film 14, which is adhering to the undersides of leads 5 and leads 6 and to the aluminum surrounding the photo-resist sites are shown in an expanded fashion for clarity. Similarly in FIG. 5, leads 5 adhere to photo-resist film 23 with photo-resist film 24 adhering to the lower side of leads 5.

In FIG. 1, we show a first embodiment where we have a substrate 1, fasteners 2 to urge metallic cover 11 toward substrate 1, aluminum tape 4 approximately 0.75 mil thick with photo-resist 13 on one side and photo-resist 14 on the other, with portions of photo-resist 13 and 14 removed and portions of aluminum tape 4 selectively etched away and exposed aluminum silver plated to form connectors 7 and 8 on leads 5 and 6 to form conductive preform 15, a first type conductive lead 5 with an elongated connector 7 to pressure connect with electronic circuitry 3 on substrate 1, a less-than-30 micron sized connector 8 to pressure connect to pads 19 of chips 10; a second type conductive lead 6 with less-than-30-micron sized connectors 8 on each end to make chip to chip connections, photo-resist film 13, with conductive leads 5 and conductive leads 6 adhering to a part of the photo-resist film 13 to form a photo-resist site, photo-resist film 14 coats the underside of conductive lead 6 and all of conductive lead 5 except approx one half of connector 7; an elastomeric pressure means 12 has a sealing rib 16, primary projections 18 above chips 10, secondary projections 17 above elongated connectors 7 and when metallic cover 11 is pulled down against substrate 1 by fasteners 2 the elastomeric pressure means 12 with projections 17 and 18 and rib 16 serves to pressure connect chips 10 with each other and to the substrate 1 while hermetically sealing the assembly against substrate 1.

Figure 2:
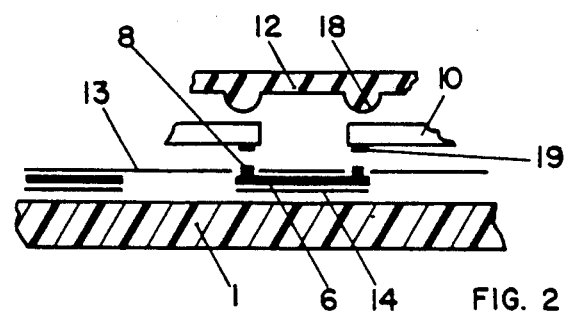
FIG. 2 shows detail of a chip to chip lead as shown in FIG. 1 with connectors to contact pads on the chips and the projection on the elastomeric pressure means to urge the chip into contact with the connectors.

In FIG. 2, we show a larger detail of conductive lead 6 with less-than-30-micron sized connector 8, usually silver on aluminum. Connector 8 could be a conductive harder metal on conductive softer metal for lead 6. Lead 6 is adhering the photo-resist 13 and has a photo-resist strip 14 completely covering the back of lead 6 and connectors 8. When elastomeric pressure means 12 is biased downward toward substrate 1, projections 18 put pressure on chips 10 and continues to hold pressure to connector 8 to contact chip pads 19 of chips 10.

Figure 3:
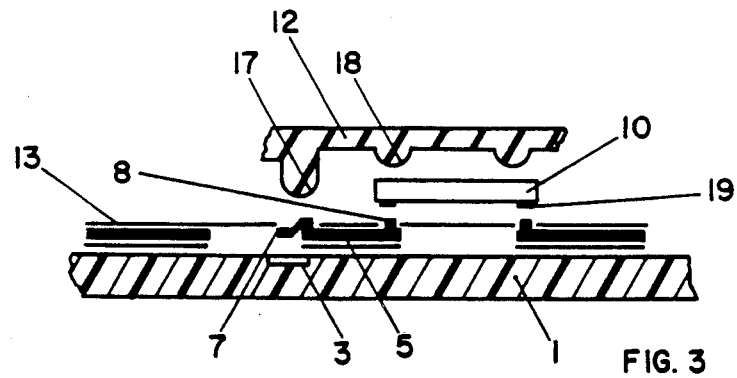
FIG. 3 shows detail of a chip to substrate lead as shown in FIG. 1 with a connector end to connect with a chip pad and another connector on the other end of the lead to contact the substrate electronic circuitry. Different length projections on the elastomeric pressure member allow compensation for the thickness of the chip as the cover urges the elastomeric pressure member toward the substrate.

In FIG. 3, a larger detail of conductive lead 5 making a connection between chip pad 19 of chip 10 with a less-than-30-micron sized silver on aluminum connector 8 on one end of conductive lead 5 and on the other end of conductive lead 5 an elongated connector 7. Approx one half of connector 7 is attached to lead 5 which is covered with photo-resist 14 and the other half of connector 7 is uncovered. Connector 7 will bend slightly downward to contact electronic circuitry 3 on substrate 1 with pressure; the thickness of elastomeric pressure means 12, length of projections 17 and 18 and relative hardness of the elastomeric material are interrelated so that when cover 11, FIG. 1 is biased toward the substrate 1 sufficient pressure is put on Connector 7 to hold it firmly in contact with circuitry 3 even if there are some variations in flatness of substrate 1. At the same time, one to two pounds pressure on the chip 10 from projections 18 will produce sufficient pressure to make the harder metal which is usually silver, in connector 8 sink into the aluminum backing of conductive lead 5 in order to compensate for the difference in flatness of chip 10 and substrate 1.

Figure 4:
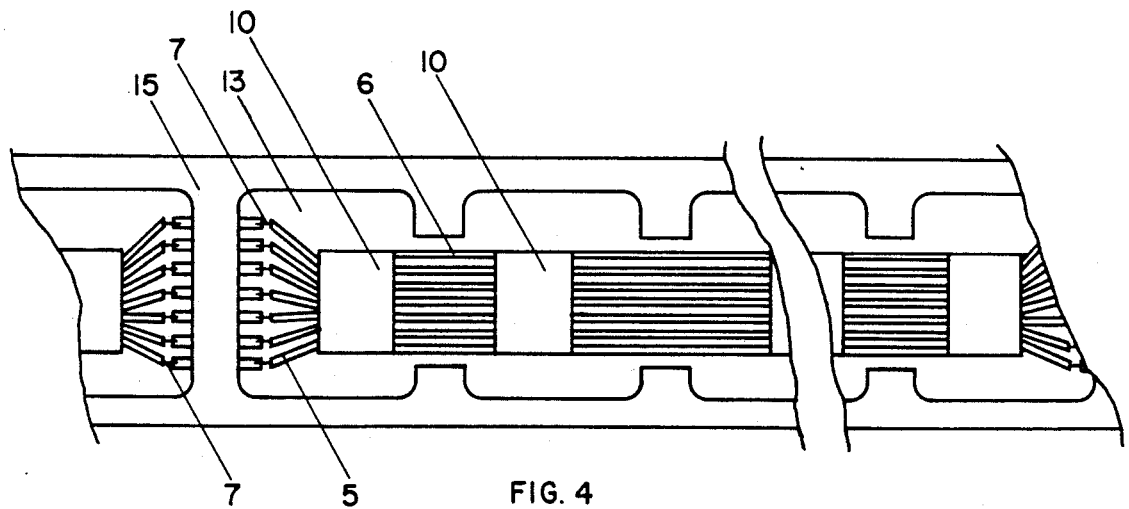
FIG. 4 shows a plan view of the conductive preform of FIG. 1 of the invention where chips are connected to chips and then to the substrate.
Figure 4A:
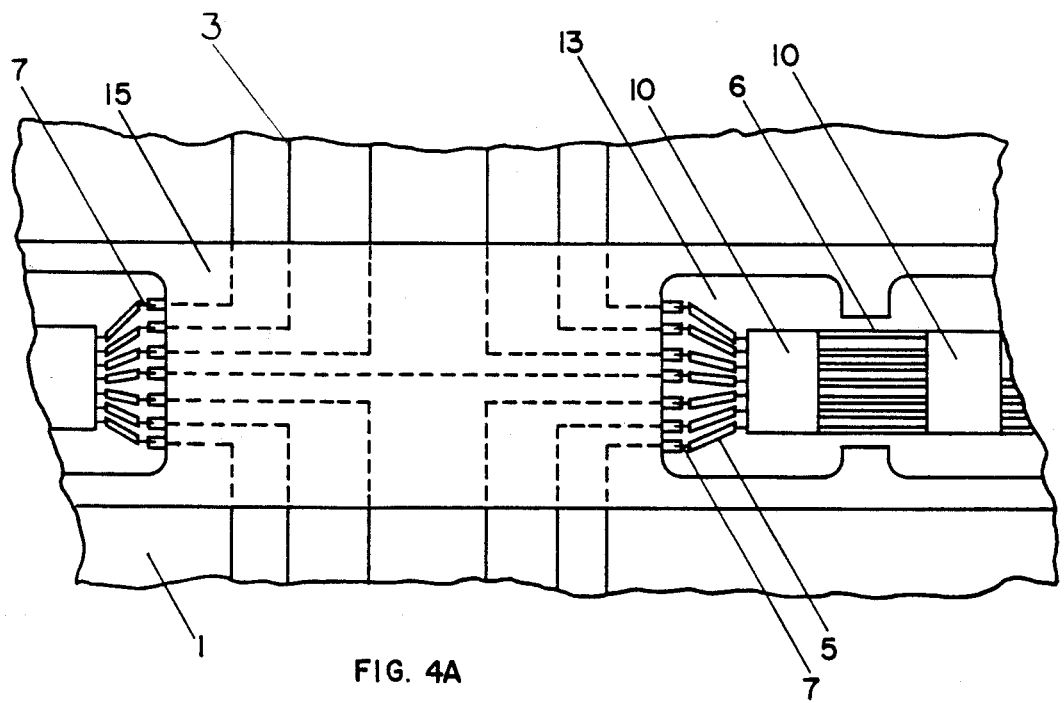
FIG. 4A shows an expanded view of a portion of FIG. 4 indicating the terminal end of a group of chips connecting to circuitry on a printed circuit board.

In FIG. 4, we show a plan view of a plurality of chips 10 of conductive preform 15 linked together by conductive leads 6 and to electronic circuitry 3 which would be visible thru photo-resist 13 on a substrate 1, FIG. 1, by connector 7 of conductive leads 5. Both leads 5 and 6 adhere to photo-resist film 13 of conductive preform 15. Shape of conductive leads 5 and 6 may be such as to minimize stretching of film 13. Note that conductive lead 6 goes between photo-resist sites as we have defined them. The drawing is diagrammatic only, actual area for these conductive leads 6 to go from chip to chip is very small relative to chip 10 size. Conductive leads 5 serve to connect each end of the plurality of chips 10 to electronic circuitry 3 on substrate 1, FIG. 1. Of course, some of the pads in the plurality of chips 10 could be connected to electronic circuitry 3 and it is not necessary to have all pads of all chips connected together before connecting to electronic circuitry on the substrate. This FIG. 4 is intended to show the concept without unnecessary complexity. In FIG. 4A conductive leads 5 are shown with connectors 7 connecting the terminal chip 10 of a group of chips 10 with electronic circuitry 3 on a printed circuit board; the portion of electronic circuitry 3 which is not visible is dotted. All numbers are the same as in FIG. 4.

Figure 5:
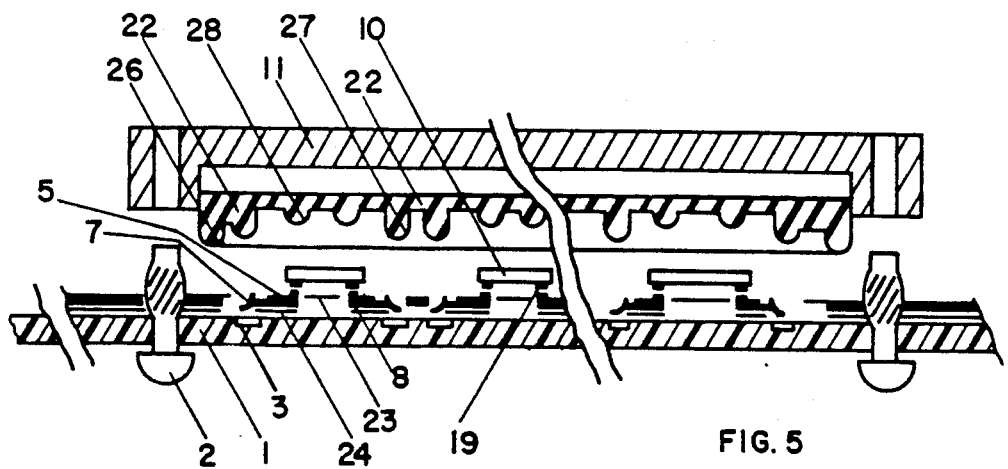
FIG. 5 shows a longitudinal cross section of a second embodiment wherein each clip is linked to wiring or electronic circuitry on a substrate. This electronic circuitry may link some or all of the chips together.

In FIG. 5, we show a longitudinal cross section of a second embodiment of the invention where each of the plurality of electronic circuit chips 10 are connected with electronic circuitry 3 on substrate 1. Both this second embodiment and the first embodiment may be connected to circuitry 3 on a substrate 1 with electronic circuitry 3 so designed that the circuitry of the total unit including the plurality of chips 10 may be plugged into a larger circuit on a larger substrate or printed circuit board.

The conductive preform 25 in this second embodiment differs from conductive preform 15 in the first embodiment since the photo-resist sites are not connected. In FIG. 5, each chip 10 is placed on photo-resist film 23 with pads 19 of chips 10 directly above less-than-30-micron sized connectors 8 of conductive lead 5 and with elongated connector 7 of conductive lead 5 above electronic circuitry 3 on substrate 1; when rigid metallic cover 11 is biased toward substrate 1 by fasteners 2, sealing rib 26 of elastomeric pressure means 22 seals the cover 11 to the substrate 1 and projections 27 pressure connects the elongated connectors 7 to electronic circuitry 3 and projections 28 exert pressure on the chips 10 so that less-than-30-micron connectors 8 connect with chip pads 19 of chips 10. Photo-resist film 24 covers the aluminum or softer metal of the conductive leads 5 but does not cover the back of elongated connector 7.

Figure 6:
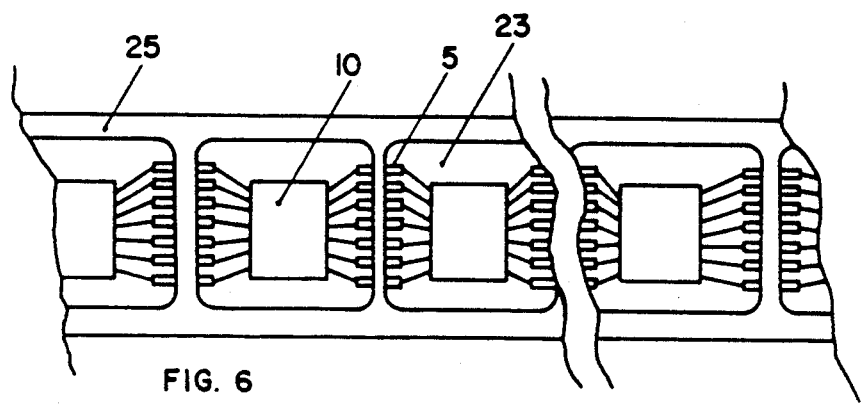
FIG. 6 shows a plan view of the conductive preform of FIG. 5 wherein each chip is linked to electronic circuitry on the substrate.

In FIG. 6, we show a plan view of conductive preform 25 of the second embodiment of the invention with chips 10 on each photo-resist site. Conductive leads 5 adhere to photo-resist 23 with elongated connectors 7 connecting each chip 10 with electronic circuitry of the substrate below.

Figure 6A:
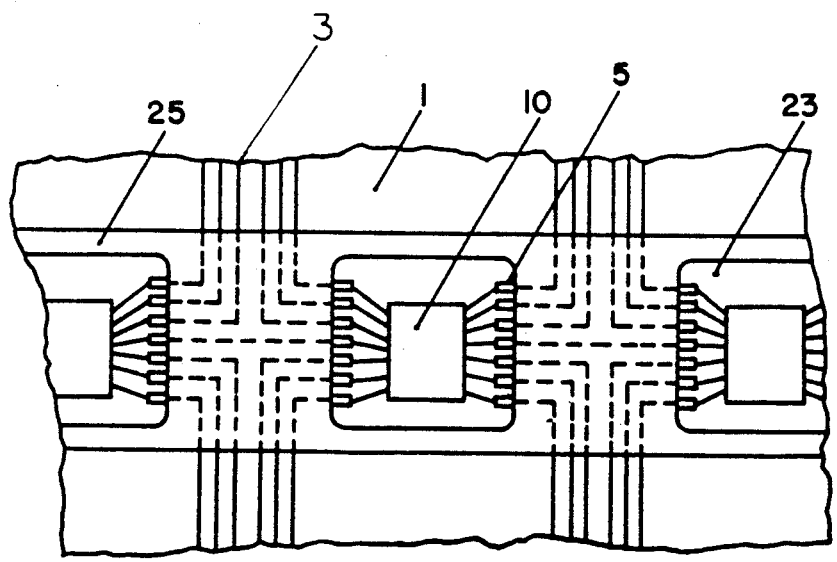
FIG. 6A shows an expanded view of FIG. 6 indicating how an individual chip connects to circuitry on a printed circuit board.

In FIG. 6A we show an expanded section of FIG. 6 to indicate more clearly how an individual chip 10 with conductive leads 5 with connectors 7 connects to circuitry 3 on a printed circuit board; the portion of electronic circuitry which is not visible is dotted.

Figure 7:
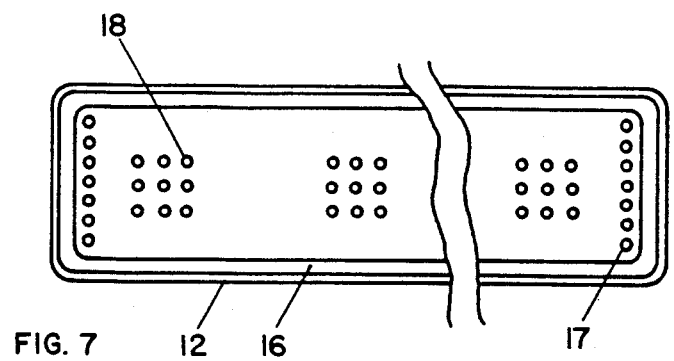
FIG. 7 shows a lower plan view of the elastomeric pressure member used in FIG. 1 indicating location of the sealing rib and different sized pressure projections.

In FIG. 7, we show a plan view of the lower side of elastomeric pressure means 12 of the first embodiment of the invention indicating location of projections 18 above the chips; projections 17 above the elongated connectors 7 of FIG. 1, and sealing rib 16 which serves to hermetically seal the cover 11, FIG. 1, to substrate 1, FIG. 1.

Figure 8:
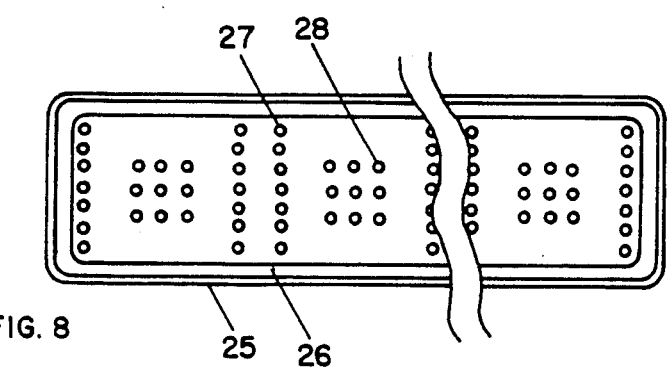
FIG. 8 shows a lower plan view of the elastomeric pressure member used in FIG. 5 indicating location of the sealing rib and pressure projections above the chip to force the chip against the chip pad connectors and larger projections above the substrate connectors.

In FIG. 8, we show a lower plan view of conductive preform 25 of the second embodiment of the invention with sealing rib 26 and projections 28 that would be above chips 10 and projections 27 that would be above elongated connectors 7.

Figure 9:
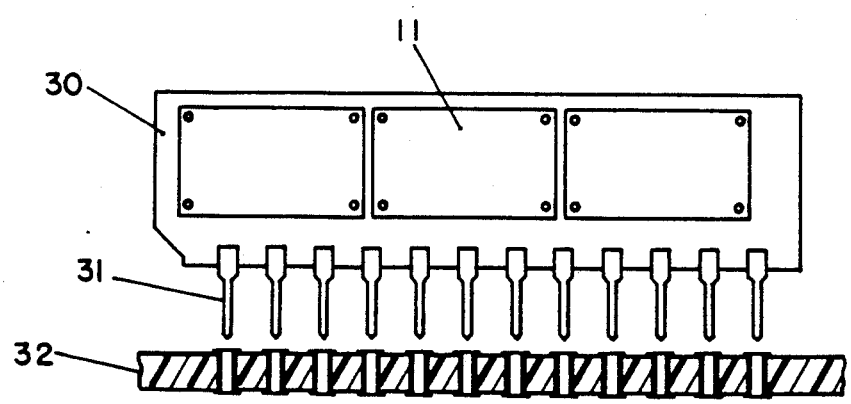
FIG. 9 shows a multiplicity of chips mounted on a mini-circuit board with a connector to plug the mini-circuit board into a larger printed circuit board.

In FIG. 9 we show metallic cover 11 fastened in a conventional manner to a mini-circuit board 30 with conventional y-shaped plug-in connectors 31 fastened in a conventional manner to board 30, connectors 31 being adapted to plug into circuitry on circuit board 32 in a conventional manner.

What is claimed is:

1. A chip connecting assembly for connecting a plurality of electronic circuit chips to a substrate, comprising;
   a. said plurality of electronic circuit chips and said substrate with electronic circuitry thereon;
   b. a conductive preform containing a plurality of photo-resist sites with each of said sites comprising multiple conductive leads on an insulating photo-resist film; a first type of said multiple conductive leads having a less-than-30-micron sized electrical connector both on a first end and a second end that may be pressured by an elastomeric pressure means into pads of an adjacent pair of said plurality of electronic circuit chips when said pair of electronic circuit chips are placed on an adjacent pair of said plurality of sites; a second type of said multiple conductive leads having a less-than-30-micron sized connector on a beginning end thereof and an elongated connector on a terminal end thereof that may be pressured with said elastomeric pressure means to connect said less-than-30-micron sized connector on said beginning end to a pad on a said electronic circuit chip and said elongated connector on said terminal end to said electronic circuitry of said substrate;
   c. a rigid metallic cover having means to fasten said cover to said substrate and containing said elastomeric pressure means, said rigid metallic cover being sized to encompass said plurality of electronic circuit chips when each of said plurality of electronic circuit chips is placed on one of said sites of said conductive preform and with said elastomeric pressure means having primary projections that pressure said less-than-30-micron sized connectors into said pads of each of said plurality of electronic circuit chips and having secondary projections to pressure said elongated connectors on a second end of said conductive leads to connect with said electronic circuitry of said substrate and having a tertiary rib-like projection to seal against said substrate when said rigid· metallic cover is biased toward said substrate by said means to fasten said cover to said substrate.

2. A chip connecting assembly for connecting a plurality of electronic circuit chips to a substrate as in claim 1 where said multiple conductive leads are aluminum and said less-than-30-micron sized electrical connectors and said elongated connectors of said multiple conductive leads are silver plated on aluminum.

3. A chip connecting assembly for connecting a plurality of electronic circuit chips to a substrate as in claim 1 where said substrate is a printed circuit board.

4. A chip connecting assembly for connecting a plurality of electronic circuit chips to a substrate as in claim 1 where said substrate is a mini-printed circuit board with output leads of electronic circuitry of said mini-printed circuit board connecting with connections suitable for plugging into circuitry on a second substrate.

5. A chip connecting assembly for connecting a plurality of electronic circuit chips to a substrate as in claim 1 where said elastomeric pressure means is a silicone type rubber of a 20 to 40 durometer hardness.

6. A chip connecting assembly for connecting a plurality of electronic circuit chips to a substrate as in claim 1 where said multiple conductive leads in said sites are so shaped as to minimize stretching of said photo-resist film supporting said multiple conductive leads.

7. A chip connecting assembly for connecting a plurality of electronic circuit chips to a substrate as in claim 1 where said less-than-30-micron sized electrical connectors and said elongated connectors of said multiple conductive leads consist of a harder metal plated on a softer metal.

8. A chip connecting assembly for connecting a plurality of electronic circuit chips to a substrate, comprising:
   a. electronic circuitry on said substrate;
   b. a conductive preform containing a plurality of photo-resist sites linearly arranged therein with each of said photo-resist sites on either end thereof having a first multiplicity of conductive aluminum leads thereon with less-than-30-micron sized connectors on first ends of said first multiplicity of conductive aluminum leads and with said first multiplicity of conductive aluminum leads so located that pads on each of said plurality of electronic circuit chips will contact said less-than-30-micron sized connectors when one of said plurality of electronic circuit chips is properly placed on one of said sites and pressure means biases said one of said plurality of electronic circuit chips toward said substrate; second ends of said first multiplicity of conductive aluminum leads having elongated connector plated thereon are so located as to contact said electronic circuitry on said substrate when pressure is applied by said pressure means to said elongated connectors of said second ends of said first multiplicity of conductive aluminum leads; a second multiplicity of conductive aluminum leads with less-than-30-micron sized connectors on each end are so dimensioned and so located that said less-than-30-micron sized connectors of said second multiplicity of conductive aluminum leads serve to contact said pads on two adjacent chips of said plurality of electronic circuit chips when said two adjacent chips are properly placed on said substrate and said pressure means pressures said electronic circuit chips towards said substrate;
   c. a rigid metallic cover that encompasses said pressure means and that encompasses said plurality of electronic circuit chips when each is placed on one of said photo-resist sites with said cover having means to bias said cover toward substrate.

9. A chip connecting assembly for connecting a plurality of electronic circuit chips to a substrate as in claim 8 where said pressure means is an elastomeric means with differing length projections to exert proper pressure against said plurality of electronic circuit chips and proper pressure against a plurality of said elongated connectors to maintain electrical connection of said elongated connectors with said electronic circuitry and to maintain electrical connection of said less-than-30-micron sized connectors with said pads, with said elastomeric means having a raised rib to seal said metallic cover against said substrate when said metallic cover is biased against said substrate.

10. A chip connecting assembly for connecting a plurality of electronic circuit chips to a substrate, comprising:

a. a conductive preform on said substrate and containing a plurality of photo-resist sites linearly arranged therein with photo-resist connections between said plurality of photo-resist sites;

b. a first type of conductive lead adhering to a lower side of a first photo-resist film of said plurality of photo-resist sites with a less-than-30-micron sized connector on one end of said first type of conductive lead extending upward through said first photo-resist film and with approximately one half of an elongated connector connected to the other end of said first type of conductive lead and extending upward through said first photo-resist film; said first type of conductive lead having a second photo-resist coating completely under said less-than-30-micron sized connector and extending full length of said first type of conductive lead and extending under approximately one half of said elongated connector, thereby allowing said elongated connector to be pressed downward to contact said electronic circuit;

c. a second type of conductive lead adhering to a lower side of said first photo-resist film of said photo-resist sites and said photo-resist connections between said plurality of photo-resist sites with less-than-30-micron sized connectors extending upward through said first photo-resist film on each end of said second type conductive lead;

d. an elastomeric pressure means, contained inside a rigid metallic cover sized to enclose said elastomeric pressure means, said plurality of electronic circuit chips, and said conductive preform with means to bias said rigid metallic cover containing said elastomeric pressure means against said plurality of electronic circuit chips on said substrate to bias said electronic circuit chips against electronic circuitry on said substrate thereby pressure connecting said elongated connectors of said first type of conductive lead with said electronic circuitry on one end and pressure connecting said less-than-30-micron sized connectors on the other end and said less-than-30-micron connectors on each end of said second type of conductive leads to pads of said electronic circuit chips when each is placed on one of said plurality of photo-resist sites thereby allowing pressure connecting of some of said electronic circuit chips to other said electronic circuit chips and same of said electronic circuit chips to said electronic circuitry of said substrate;

e. a projecting rib on said elastomeric pressure means; said projecting rib serving to hermetically seal said rigid metallic cover against said substrate when said rigid metallic cover is biased toward said substrate.

11. A chip connecting assembly for connecting a plurality of electronic circuit chips to a substrate as in Claim 10 where said less-than-30-micron sized connectors and said elongated connectors are a harder metal attached to a softer metal of said conductive leads and where said elastomeric pressure means contained in said rigid metallic cover is of proper elastomeric composition with proper length projections above each of said plurality of electronic circuit chips placed on each of said photo-resist sites and said cover is of proper size such that when said cover is biased against said substrate, said elastomeric pressure means exerts sufficient pressure against said chips such that said harder metal of said less-than-30-micron sized connectors may sink into said softer metal of said conductive leads thereby compensating for the difference in flatness of said substrate and said electronic circuit chips.

* * * * *